United States Patent [19]

Meigs et al.

[11] 4,121,119

[45] Oct. 17, 1978

[54] PULSE PEAK DETECTOR

[75] Inventors: Gordon Wallace Meigs; Wayne Donald Thomas, both of Beaverton, Oreg.

[73] Assignee: Tektronix, Inc., Beaverton, Oreg.

[21] Appl. No.: 769,074

[22] Filed: Feb. 16, 1977

[51] Int. Cl.$^2$ ............................................. H03K 5/00
[52] U.S. Cl. .................................... 307/351; 307/261; 307/359; 328/151
[58] Field of Search ................... 307/233 R, 234, 261, 307/264, 351, 359; 328/115, 139, 151

[56] References Cited

PUBLICATIONS

"Peak Detector for Very Narrow Pulses", by M. J. Prickett, EEE, vol. 19, No. 4, Apr. 1971, p. 60.

*Primary Examiner*—John Zazworsky
*Attorney, Agent, or Firm*—George T. Noe

[57] ABSTRACT

A pulse peak detector for producing a D.C. voltage level corresponding to the peak amplitude of an input signal. A differential comparator is utilized to compare the input signal to the output level, and to activate a control circuit when the peak amplitude of such input signal exceeds the output voltage. The control circuit includes a current source which operates for a predetermined resettable time interval to provide a charging current path for a storage capacitor. An emitter follower is disposed between the storage capacitor and the system output to isolate the capacitor from any output loading. For short-duration repetitive input pulses, for example, 10 nanoseconds or less, a latch circuit insures activation of the timing circuit.

2 Claims, 2 Drawing Figures

PULSE PEAK DETECTOR

BACKGROUND OF THE INVENTION

The present invention relates generally to peak detector circuits, and more particularly, to circuits for detecting the peak amplitudes of extremely short-duration repetitive pulses.

The simplest form of peak detector is the conventional serial connection of a diode and capacitor to which an electrical signal is applied. The signal peak, minus the voltage drop of the diode, is stored in the capacitor and the output is taken thereacross. For large signals, for example, 50 volts or more, the half-volt diode drop is considered negligible; however, for the low-voltage signals prevelant in modern electronic equipment, even a half-volt diode drop is intolerable.

It is well known in the art to utilize a differential comparator in conjunction with a conventional peak detector circuit for generating signals corresponding to an incoming signal peak or a percentage thereof. It is also known to utilize a differential comparator having a feedback loop which includes a peak detector for producing a D.C. voltage level corresponding to the peak amplitude of an incoming analog signal of relatively low frequency. However, peak detection of short-duration repetitive pulses, particularly those having low repetition rates, presents a special problem in that not only must the peak amplitude be accurately detected but also a D.C. voltage level corresponding thereto must be provided. Generally, prior art pulse peak detectors have employed a first capacitor having a short time constant for charging quickly to the peak voltage, and a second capacitor having a fairly long time constant for holding the peak value between pulses.

In multi-function test and measurement instruments, the input comparator may be used in modes other than peak detection. One such mode may be a count mode wherein the comparator produces output pulses to be applied to counter circuitry in response to the comparison of an input signal with an adjustable reference level. To reduce noise effects on the comparator, and thereby minimize false count due to power supply noise spikes, an RC network having a rather long time constant is connected to the reference input of the comparator. In the peak detection mode, this RC network results in a long feedback response time, which may be, for example, 20 milliseconds or more.

Furthermore, it would be desirable in many applications to detect both positive and negative peaks wherever they occur in the amplitude range, whether above or below ground reference.

SUMMARY OF THE INVENTION

According to the present invention, a pulse peak detector is provided which produces D.C. voltage levels corresponding to the peak amplitude of an applied input signal consisting of extremely short-duration repetitive pulses. The present invention is also capable of operation at low frequencies and D.C., and consequently is responsive over an extremely wide bandwidth.

A differential comparator is utilized to compare the input signal to the output level and to activate a control circuit including a current source for a predetermined minimum period of time when the peak amplitude of such input signal exceeds the output voltage. The current source provides a low-impedance charging path for a storage capacitor. An emitter follower is disposed between the storage capacitor and the system output to isolate the capacitor from any output loading. Further, the emitter follower may be connected between suitable positive and negative power supplies, permitting the output voltage range to vary between predetermined limits above and below ground. Thus, positive peaks may be detected at any point they occur within the predetermined range. The circuit of the present invention will accurately detect the peak amplitudes of pulses having pulse widths of less than 10 nanoseconds. An identical peak detector circuit utilizing oppositely-poled semiconductor devices may be utilized to detect and store negative voltage peaks in the same manner.

It is therefore one object of the present invention to provide a novel, high performance peak detector for producing a D.C. voltage level corresponding to the peak amplitude of an input signal.

It is another object to provide a peak detector for accurately detecting peak amplitude of pulses having pulse widths of 10 nanoseconds or less.

It is an additional object to provide a novel peak detector capable of detecting both positive and negative peak amplitudes of wide bandwidth signals.

It is yet another object to provide a novel peak detector capable of detecting peak amplitudes both above and below the system reference level.

It is yet an additional object to provide a high performance peak detector utilizing a comparator which is utilized for multi-function purposes and has a long feedback response time.

It is a further object to provide a high performance peak detector of simple construction utilizing inexpensive parts.

Other objects and advantages of the present invention will become apparent to those having ordinary skill in the art when taken in conjunction with the accompanying drawings.

DETAILED DESCRIPTION OF THE INVENTION

Figure 1:
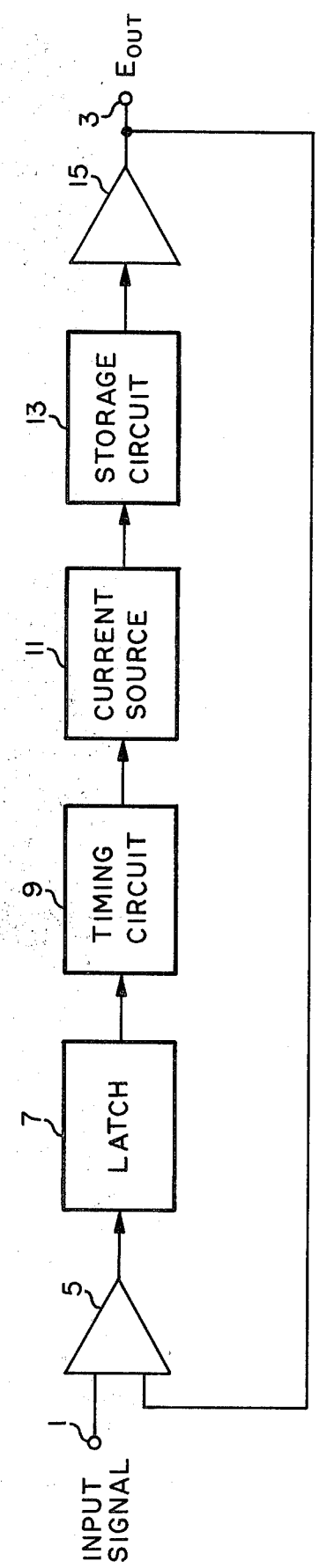
FIG. 1 shows a block diagram representation of a pulse peak detector in accordance with the present invention.

With reference to FIG. 1, there is illustrated in block diagram form a peak detector circuit wherein the peak amplitude of an electrical signal applied to input terminal 1 may be accurately detected and a corresponding D.C. output voltage produced at output terminal 3. The peak detector circuit includes a differential comparator 5, a latch 7, a timing circuit 9, a current source 11, a storage circuit 13, and a buffer amplifier 15. The output D.C. voltage at terminal 3 is applied to one input of differential comparator 5 as a reference. When the amplitude of the input signal exceeds this reference, comparator 5 switches, resetting the timing circuit 9 through latch 7. The timing circuit 9 will be held in the reset condition as long as the input signal amplitude exceeds the output reference level. On extremely short-duration input pulses, for example, pulses having widths of 10 nanoseconds or less, the latch circuit 7 remains latched for a predetermined period of time to insure complete resetting of the timing circuit 9. When the timing circuit 9 is reset, the current source 11 is switched on, providing charging current to storage circuit 13, which may suitably be a storage capacitor. The timing circuit 9 determines the length of time that current source 11 will remain switched on after complete reset. Thus, on extremely short-duration pulses, a predetermined minimum charge is placed on the storage capacitor. Thus, it will take several input pulses to "pump" the stored voltage up to the peak amplitude level. Of course, on the low-frequency input signals and those having a high duty factor, the timing circuit 9 is held in the reset condition for a longer period of time, allowing the current source 11 to remain on for a longer period of time and consequently charging the storage circuit 13 quickly to the peak amplitude value. The voltage stored by the storage circuit 13 is applied through buffer amplifer 15 to the output terminal 3 as well as to the reference input of comparator 5.

Figure 2:
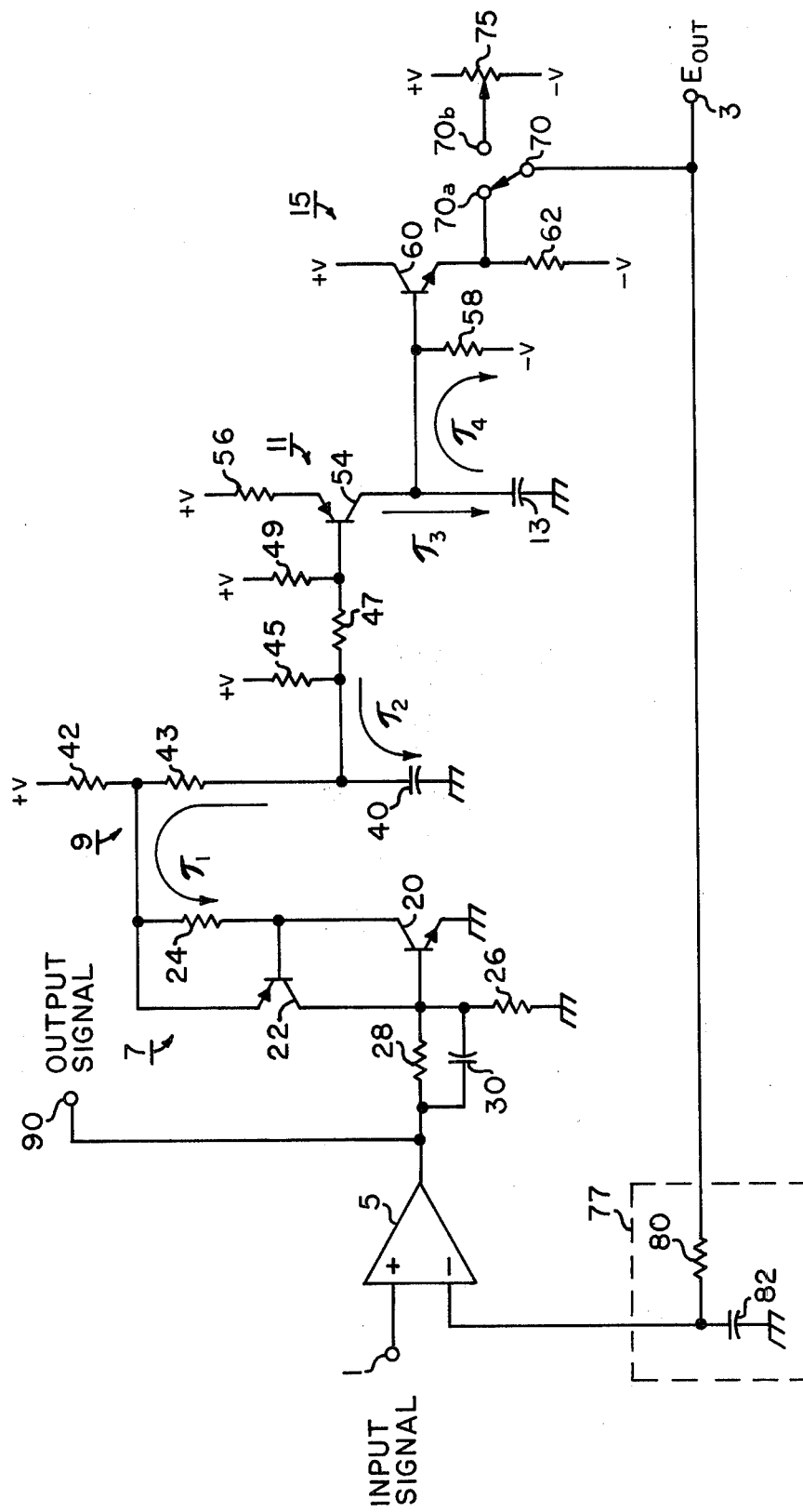
FIG. 2 shows a schematic diagram of a detector circuit in accordance with the present invention.

FIG. 2 is a detailed schematic diagram of the peak detector circuit discussed hereinabove. The comparator 5 may suitably be an integrated-circuit operational amplifier in which the input signal from terminal 1 is applied to the + input terminal thereof and the reference level from the output terminal 3 is applied to the − input terminal thereof. In this configuration, the two-state output thereof is high when the voltage at the + input terminal is positive with respect to the voltage at − input terminal, and low when the voltage at the + input terminal is negative with respect to the voltage at the − input terminal. The device switches to produce an error output when the voltages at the respective input terminals pass through a point at which they are balanced. Thus, the comparator 5 described herein is conventional and well known in the art.

The latch circuit 7 includes transistors 20 and 22 connected in a regenerative relationship, and biasing resistors 24 and 26. The input thereto is applied from the output of comparator 5 through a resistor 28 and a speed-up capacitor 30 and developed across resistor 26. Transistor 20 is an NPN conductivity type and transistor 22 is a PNP conductivity type. When the output of comparator 5 switches high, transistor 20 turns on, drawing current through current-sensing resistor 24. The voltage developed across resistor 24 biases transistor 22 into conduction, sinking current through resistor 26. The voltage developed across resistor 26 then provides sufficient bias to maintain transistor 20 in its conductive state. Thus, transistors 20 and 22 are latched on as long as a current supply is provided for resistor 24 and transistor 22.

The timing circuit 9 consists principally of capacitor 40 and its charge and discharge paths. These paths include the resistors 42–49, and portions of the latch circuit 7 and current source 11. The current source 11 consists of a PNP transistor 54 and its emitter resistor 56. The timing circuit 9 is connected to the base of transistor 54 to provide the biasing control thereof.

The current source 11 provides a charging current path for storage capacitor 13, which is connected in series with the collector of transistor 54. The value of resistor 56 is chosen to provide a predetermined charging current, and as will become apparent later in connection with the discussion of the overall operation of the circuit, this current flows for a predetermined time interval to place a predetermined charge on capacitor 13. A resistor 58 is connected to capacitor 13 to provide a discharge path therefor.

The buffer amplifier 15 consists of NPN transistor 60 and its emitter resistor 62 connected as a conventional emitter follower with the output thereof connected through the switch 70 to the output terminal 3. The emitter follower circuit is connected between suitable positive and negative voltage supplies so that the output thereof may range to predetermined limits both above and below ground.

The circuit shown in FIG. 2 may be utilized in multi-function instruments where producing a D.C. output level corresponding to the peak amplitude of an input signal is only one function. Thus, the switch 70 may be connected to terminal 70b so that the reference level for comparator 5 is taken from the center tap of a potentiometer 75, which may be connected between suitable positive and negative voltage supplies to provide a selectable reference level therebetween. To prevent high frequency transients or voltage spikes in either of these supplies from inadvertently switching the comparator 5, a filter 77 consisting of resistor 80 and capacitor 82 may be provided to prevent these undesirable electrical quantities from reaching the − input terminal of comparator 5. Terminal 90, connected to the output of comparator 5, provides a comparator output signal to be utilized by other circuits, such as counters or the like. However, even though the response time of the reference voltage supplied to comparator 5 may be slowed as much as 20 milliseconds by the filter 77, the circuit shown will accurately detect the peak amplitudes of signals having pulse widths of 10 nanoseconds or less.

The peak detector circuit of FIG. 2 operates as follows: an input signal is applied to terminal 1, and this signal may be a slowly varying low-frequency signal, or it may be a series of repetitive pulses. For this discussion, let us assume that the input signal is a series of positive-going 20-nanosecond pulses occurring at a frequency of 40 hertz. As can be discerned, this is an extremely low-duty factor signal. Assuming that the amplitude of the input pulses is greater than the output level at terminal 3, the error output of comparator 5 is positive-going 20-nanosecond pulses. The error output of comparator 5 is applied through the combination of resistor 28 and capacitor 30 to the base of transistor 20, activating the latch as described hereinabove. Prior to the input pulse, capacitor 40 was charged to some voltage $+V$. When transistor 20 turns on, a discharge path is provided and capacitor 40 begins to discharge through transistor 20 and resistor 24, turning on transistor 22. Even though the positive-going pulse is applied to the base of transistor 20 for only 20 nanoseconds, the transistors 20 and 22 will remain on as long as capacitor 40 can furnish current to the latch circuit. As capacitor 40 discharges, the base of current source transistor 54 is pulled negative, biasing transistor 54 into conduction and charging current begins to flow into capacitor 13. The value $\tau_1$ illustrated is the RC rate of the discharge path for capacitor 40 and is equal to approximately 10 microseconds. Therefore, the reset time, that is, the time required for capacitor 40 to discharge completely, is approximately 50 microseconds. At the end of the reset period, there is insufficient current through resistor 24 to maintain the conduction of transistor 22, and the latch circuit 7 reverts back to its quiescent state. Capacitor 40 then begins to charge through the resistive network comprising resistors 42–49. The value $\tau_2$ shown in the illustration represents the RC charging rate, and is equal to approximately 0.5 milliseconds. After approximately 2 milliseconds, the voltage at the base of transistor 54 has risen sufficiently positive to cut transistor 54 off. During this period of time, a predetermined charge was placed on capacitor 13. The $\tau_3$ illustrated represents the RC charging rate for capacitor 13, and may be in the order of 0.25 to 0.5 seconds; however, the capacitor does not charge for this period of time because the current source is controlled by timing circuit 9 as just discussed. When current source 11 turns off, capacitor 13 begins to discharge through resistor 58 at an RC-controlled rate. The quantity $\tau_4$ shown in the illustration may suitably be about 2.5 minutes. Thus, a long time constant is provided to maintain the stored charge.

It can be discerned that capacitor 13 will charge quickly to the peak amplitude value, even on the extremely low duty factor signals because it will take only a few input pulses to "pump" capacitor 13 up to the desired value. For signals occurring at higher repetition rates, the successive pulses may trip the latch and discharge capacitor 40 before it has a chance to charge up to a value which will turn the current source 11 off. For signals having pulse widths that are fairly wide, it can be seen that the latch circuit will simply remain turned on as long as the amplitude of the pulse exceeds the level at output terminal 3, keeping capacitor 40 in a discharged state until capacitor 13 charges to the peak amplitude value. From the foregoing, it can be seen that the peak detector circuit will accurately detect the peak amplitudes of input signals having a wide range of pulse widths, repetition rates, and frequencies.

In some circuit applications, it may be desirable to hold the charge on capacitor 13 for a predetermined time without any decay of the voltage. It is well known in the art to replace resistor 58 with a transistor that can be turned on after a predetermined time interval, for example, 5 seconds, to dump the charge through a low-impedance path. Such a circuit is shown in copending application Ser. No. 688,208, filed May 20, 1976. It would be well within the design purview of one having ordinary skill in the art to provide a timing circuit and current-drain transistor to provide a quick discharge of capacitor 13 after a predetermined time interval.

While the circuit shown and described in connection with FIG. 2 detects the peak amplitudes of positive-going signals, a similar circuit for detecting negative peaks may be constructed by using transistors having conductivity types opposite from those shown and by reversing the power supply polarities. Alternatively, comparator 5 can be operated in an inverting mode by applying the input signal to the − input and the reference voltage to the + input. This would allow the latch transistors 20 and 22 to remain as they are; however, an inverting stage would be necessary at the output to cause a negative voltage to be stored by storage means 13.

It will be obvious to those having ordinary skill in the art that many changes and modifications may be made in the details of the above-described embodiment of the present invention. For example, different types of active devices such as transistors and integrated circuits may be employed, and power supply voltages and component values may be chosen to provide desired operation without changing the basic operating principals of the system hereinabove described. Rather than a bipolar transistor for buffer amplifier 15, a field-effect transistor could be used. Therefore, the scope of the present invention should be determined only by the following claims.

We claim:

1. A peak detector for producing a D.C. voltage proportional to the peak amplitude of an input signal, said peak detector including an input signal path, a storage element for storing a peak voltage value and providing a D.C. voltage output therefrom, and a comparator for generating an error signal when the amplitude of the input signal exceeds the output voltage, wherein the improvement comprises:
   control circuit means for controlling the voltage to which said storage element charges, said control circuit means including a current source coupled to said storage element, a resettable timing circuit coupled to said current source for turning said current source on for at least a predetermined time period to provide current to charge said storage element, and latch means responsive to said error signal for resetting said timing circuit and thereby turning said current source on, said latch means comprising a pair of oppositely-poled transistors connected in a regenerative relationship.

2. A pulse peak detector for producing a D.C. voltage proportional to the peak amplitude of a repetitive pulse input signal, comprising:
   a comparator having first and second control terminals and an output, said first control terminal adapted to receive said input signal;
   storage means for providing an output voltage which is an accurate representation of the peak amplitude of said input signal, said storage means coupled to said second control terminal of said comparator so that said output voltage provides a reference therefor;
   latch means coupled to said comparator output and being activated in response to the peak amplitude of said input signal exceeding said reference;
   timing circuit means coupled to said latch means and being reset thereby; and
   current source means coupled to said timing circuit means and to said storage means to provide a predetermined charge current therefor, said timing circuit means turning said current source means on for a predetermined time interval after being reset, wherein said latch means includes a pair of oppositely-poled transistors connected in a regenerative relationship so that both of said transistors are turned on by said comparator output and maintained in a conducting state during reset of said timing circuit means.

* * * * *